United States Patent [19]
Toro-Lira et al.

[11] Patent Number: 5,493,116
[45] Date of Patent: Feb. 20, 1996

[54] DETECTION SYSTEM FOR PRECISION MEASUREMENTS AND HIGH RESOLUTION INSPECTION OF HIGH ASPECT RATIO STRUCTURES USING PARTICLE BEAM DEVICES

[75] Inventors: Guillermo L. Toro-Lira, Sunnyvale; Alan H. Achilles, San Jose, both of Calif.; Nolan V. Frederick, Boulder, Colo.; Kevin M. Monahan, Cupertino; Philip R. Rigg, Saratoga, both of Calif.

[73] Assignee: Metrologix, Inc., San Jose, Calif.

[21] Appl. No.: 141,669

[22] Filed: Oct. 26, 1993

[51] Int. Cl.⁶ ............................................. H01J 37/244
[52] U.S. Cl. ................................... 250/310; 250/397
[58] Field of Search ............................ 250/310, 397, 250/398; 313/103 CM, 105 CM

[56] References Cited

U.S. PATENT DOCUMENTS

| | | | |
|---|---|---|---|
| 4,011,450 | 3/1977 | Tagawa et al. | 250/310 |
| 4,219,731 | 8/1980 | Migitaka et al. | 250/310 |
| 4,588,890 | 5/1986 | Finnes | 250/310 |
| 4,868,344 | 9/1989 | Fukuhara et al. | 250/310 |
| 4,958,079 | 9/1990 | Gray | 250/310 |
| 5,332,898 | 7/1994 | Toro-Lira et al. | 250/310 |

*Primary Examiner*—Jack I. Berman
*Assistant Examiner*—Kiet T. Nguyen
*Attorney, Agent, or Firm*—Burns, Doane, Swecker & Mathis

[57] ABSTRACT

Improved techniques for imaging high-aspect-ratio structures such as contact holes utilize two signal detection sub-systems, one optimized for imaging at the top and another optimized for imaging at the base of submicrometer structures. These detection systems produce signals that can be combined in real-time to produce an image which resembles the "extended focus" images obtained with confocal optical microscopes. Unlike the confocal image, however, the resulting image has the inherent linearity and resolution characteristics of electron-beam technology. Using the new approach, the signal, rather than exhibiting a near-zero minimum at the base of the structure as is typical of the prior art, exhibits its maximum at the base of the structure, allowing high-precision measurement with no need for extrapolation.

10 Claims, 9 Drawing Sheets

DETECTION SYSTEM FOR PRECISION MEASUREMENTS AND HIGH RESOLUTION INSPECTION OF HIGH ASPECT RATIO STRUCTURES USING PARTICLE BEAM DEVICES

BACKGROUND OF THE INVENTION

1. Field of the Invention

The present invention relates to particle beam metrology wherein a particle beam device such as a scanning electron microscope is used to inspect and perform critical dimension measurements of objects, for example integrated circuit wafers.

2. State of the Art

It is known to use electromagnetic systems in microscopes such as scanning electron microscopes (SEM) for inspection and measurement purposes. Scanning electron microscopes are often used in place of traditional optical microscopes for microelectronics inspection and metrology applications in semiconductor manufacturing. The metrology tools are often used, for example, for measuring patterns (i.e. critical dimensions) formed on semiconductor wafers during fabrication.

The short wavelengths of scanning electron microscopes have several advantages over conventionally used optical microscopes. For example, scanning electron microscopes can achieve resolutions from about 100 Å to 200 Å, while the limit of resolution of optical microscopes is typically about 2500 Å. Further, scanning electron microscopes provide depth of field greater than optical microscopes. Despite the accuracy and precision of present scanning electron microscopes, enhanced instrument specifications and capabilities are required as parameters (e.g. critical dimensions) to be inspected come within the sub-micrometer range.

An article entitled "Microelectronics Dimensional Metrology in the Scanning Electron Microscope", Parts I and II, *Solid State Technology*, by Michael T. Postek et al. November 1986), describes a typical SEM wafer inspection system. As described therein, as focused electron beam is scanned from point to point on the specimen surface in a rectangular raster pattern. Accelerating voltage, beam current and spot diameter are optimized for the specific application and specimen composition.

As the scanning electron beam contacts the surface of the specimen, backscattered and/or secondary electrons are emitted from the specimen surface. Semiconductor inspection, analysis and metrology is performed by detecting the backscattered and/or secondary electrons. A point by point representation of the specimen is obtained on a CRT screen as the electron beam controllably scans the specimen.

Figure 1:
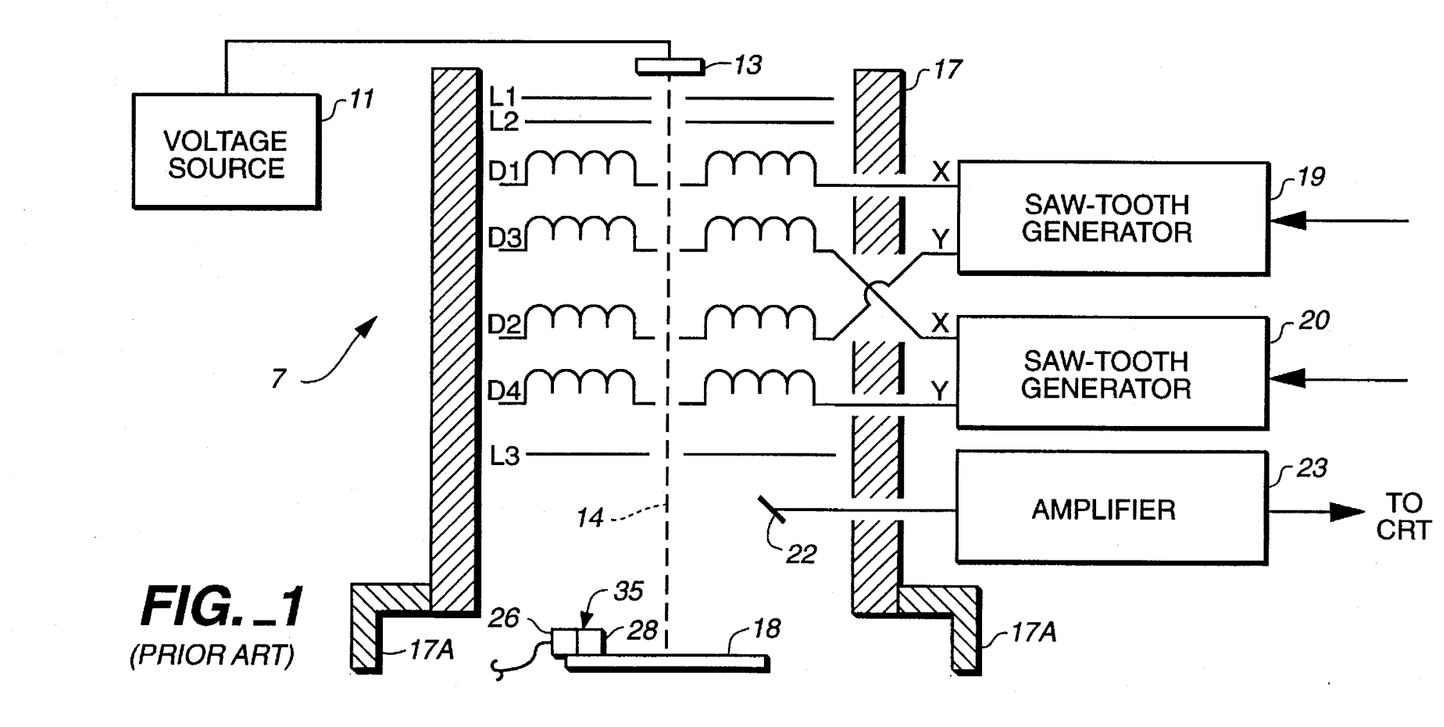
FIG. 1 is a simplified diagram of a conventional scanning electron microscope.

Conventionally, a particle beam device such as a scanning electron microscope 7, shown in FIG. 1, includes a voltage source 11. The voltage source 11 is connected to an electron source 13 that directs a narrow beam of highly accelerated electrons towards a specimen stage 18 via a plurality of electron lenses $L_1$, $L_2$, and $L_3$. The electron beam is indicated by the dashed line 14. The electron beam may be focused onto a wafer stage of the scanning electron microscope using an autofocus technique.

As further shown in FIG. 1, a cylindrical column 17 houses the electron source 13 and the lenses $L_1$, $L_2$, and $L_3$. The column 17 is normally referred to as an electron optical column and includes a chamber, indicated in the drawing as 17A, that surrounds and supports a specimen stage 18. Together, the optical column 17 and the chamber 17A represent the body of the scanning electron microscope.

The scanning electron microscope 7 of FIG. 1 further includes an electromagnetic or electrostatic deflection system for selectively scanning the electron beam across the specimen stage 18. As shown, the deflection system includes four pairs of electron beam scanning coils, designated $D_1$ through $D_4$. The scanning coils are located within optical column 17 for focusing the electron beam on the surface of the specimen held on stage 18. The pair of deflection coils $D_1$ and $D_2$ are connected to sawtooth voltage generator 19, and the pair of deflection coils $D_3$ and $D_4$ are connected to sawtooth voltage generator 20.

The electron beam scanning coils $D_1$ through $D_4$ deflect the electron beam 14 in two, generally perpendicular, directions. In the drawing, the deflection directions are designated as the x-direction and the y-direction, respectively. The x-direction and the y-direction typically are in a plane perpendicular to the direction of beam 14, but strict orthogonality is not required. For present purposes, it can be assumed that coils $D_1$ and $D_3$ deflect the scanning beam in the x-direction and that coils $D_2$ and $D_4$ deflect the scanning beam in the y-direction.

An electron collector 22 is arranged near the surface of a stage 18 which is exposed to beam 14. The electron collector is connected to an amplifier 23 which typically provides signals to an analog-to-digital converter for transforming the collected electron current to digital signals which may be subsequently displayed on a video display.

In operation, saw-tooth generators 19 and 20 provide time-varying voltage signals to electron beam scanning coils $D_1$ and $D_4$ such that beam 14 is deflected across specimen stage 18 in a predetermined scanning pattern. The saw-tooth generators 19 and 20 typically operate synchronously to drive the electron beam across stage 18 in the x-direction at a constant rate, with each scan beam deflected in the y-direction to form a series of generally parallel scanning lines.

During operation of the FIG. 1 scanning electron microscope, collector 22 detects changes in the electron current at stage 18. Thus, as the electron beams scans a specimen on stage 18, changes in the composition, texture and topography of the specimen causing amplitude variations of the electron current detected by collector 22. With each complete scanning sequence, an image corresponding to features of the specimen can be created.

Figure 2:
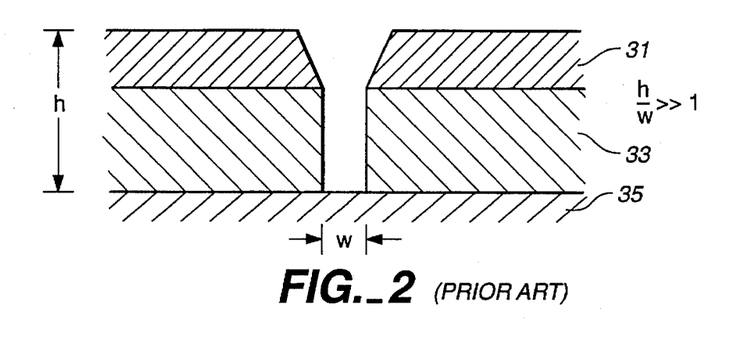
FIG. 2 is a sectional view of a contact hole portion of a semiconductor wafer structure.

Traditional methods of electron imaging rely on secondary electron emission and, as a result, have limited capability for extracting information from the base of sub-micrometer contact holes and other high-aspect-ratio structures. Such a high-aspect-ratio contact hole is a common feature of semiconductor wafers and is shown in FIG. 2. A layer of resist 31 has been used to pattern a sub-micrometer contact hole in a layer of oxide 33 coated on the surface of a wafer 35. The height h of the contact hole is considerably greater than the width w of the contact hole such that h/w >>1. Typical values of h and w might be 2.0 μm and 0.5 μm respectively, giving an aspect ratio of 4:1.

Figure 3:
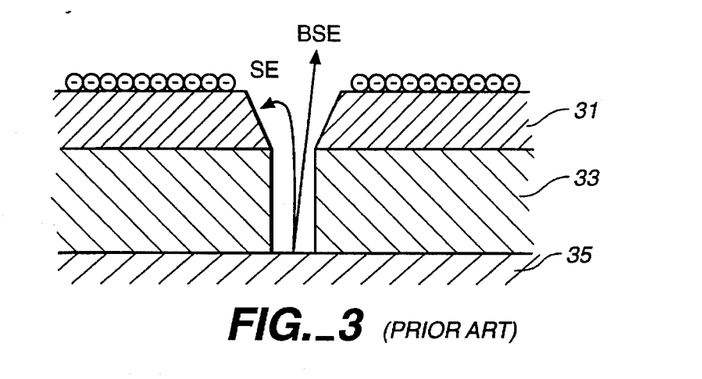
FIG. 3 is a sectional view, like that of FIG. 2, showing the effects of surface charge accumulation.

The difficulty of imaging high-aspect-ratio structures using traditional methods of secondary electron imaging holds particularly true for structures with nearly vertical profiles. Because of the insulating properties of oxide and photoresist, directing a primary electron beam onto the wafer structure causes negative surface charge to accumulate at the surface of the photoresist layer as illustrated at FIG. 3. A few volts of surface potential can severely disturb the secondary electron image, since secondary electrons (SE) are typically emitted with energies less than 10 electron volts. In cases of severe charging, commonly encountered when imaging contact holes, secondary electron emission from the base may be shut off entirely leaving only the signal from backscatter electrons (BSE). Attempts to control surface fields have been only partially effective and may themselves introduce artifacts by modulating the landing energy of the primary electron beam.

Figure 4:
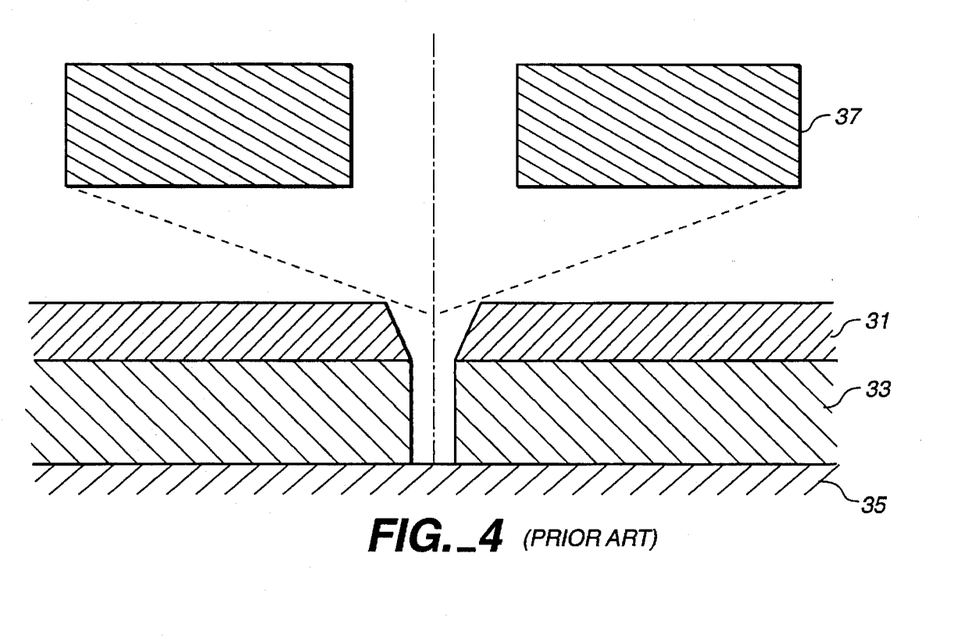
FIG. 4 is a sectional view showing the limited penetration into a high-aspect-ratio structure of the cone of vision of an electron detector.
Figure 5:
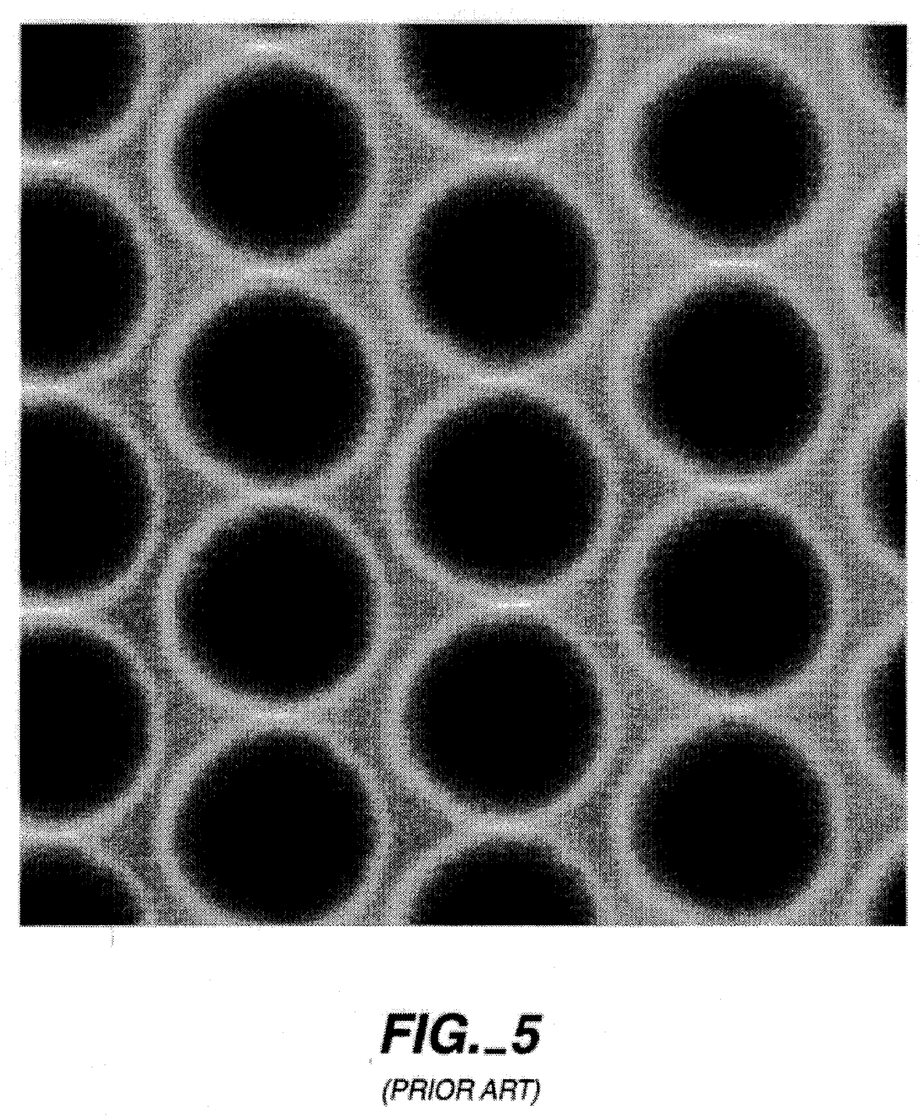
FIG. 5 is a scanning electron micrograph using traditional techniques of high-aspect-ratio contact holes.

The inability of conventional secondary and backscattered (BSE) electron imaging techniques to effectively image high-aspect-ratio structures is further exacerbated by the situation such as illustrated in FIG. 4. The current art teaches that, for greatest collector efficiency, an electron detector 37 must be placed so that its cone of vision or acceptance angle barely penetrates inside the contact hole. The bottom of the contact hole, which is of greatest interest to assure that penetration of the oxide layer has occurred, cannot even be imaged. This result is seen clearly in FIG. 5, showing a scanning electron micrograph using traditional methods of 0.5 μm contact holes in a 2.0 μm layer of photoresist and oxide. The regions in the vicinity of the contact openings appear as darkened circles. The darkened circles, however, rather than conveying information concerning the base of the contact holes, convey a lack of information thereof.

Accordingly, a need exists for improved imaging techniques for extracting information from the base of submicrometer contact holes and other high-aspect-ratio structures.

SUMMARY OF THE INVENTION

The present invention, generally speaking, provides improved imaging techniques for imaging high-aspect-ratio structures such as contact holes. These techniques represent a departure from conventional approaches to this class of imaging problems. The new approach utilizes two signal detection sub-systems, one optimized for imaging at the top and another optimized for imaging at the base of sub-micrometer structures. These detection systems produce signals that can be combined in real-time to produce an image which resembles the "extended focus" images obtained with con focal optical microscopes. Unlike the confocal image, however, the resulting image has the inherent linearity and resolution characteristics of electron-beam technology.

Figure 6:
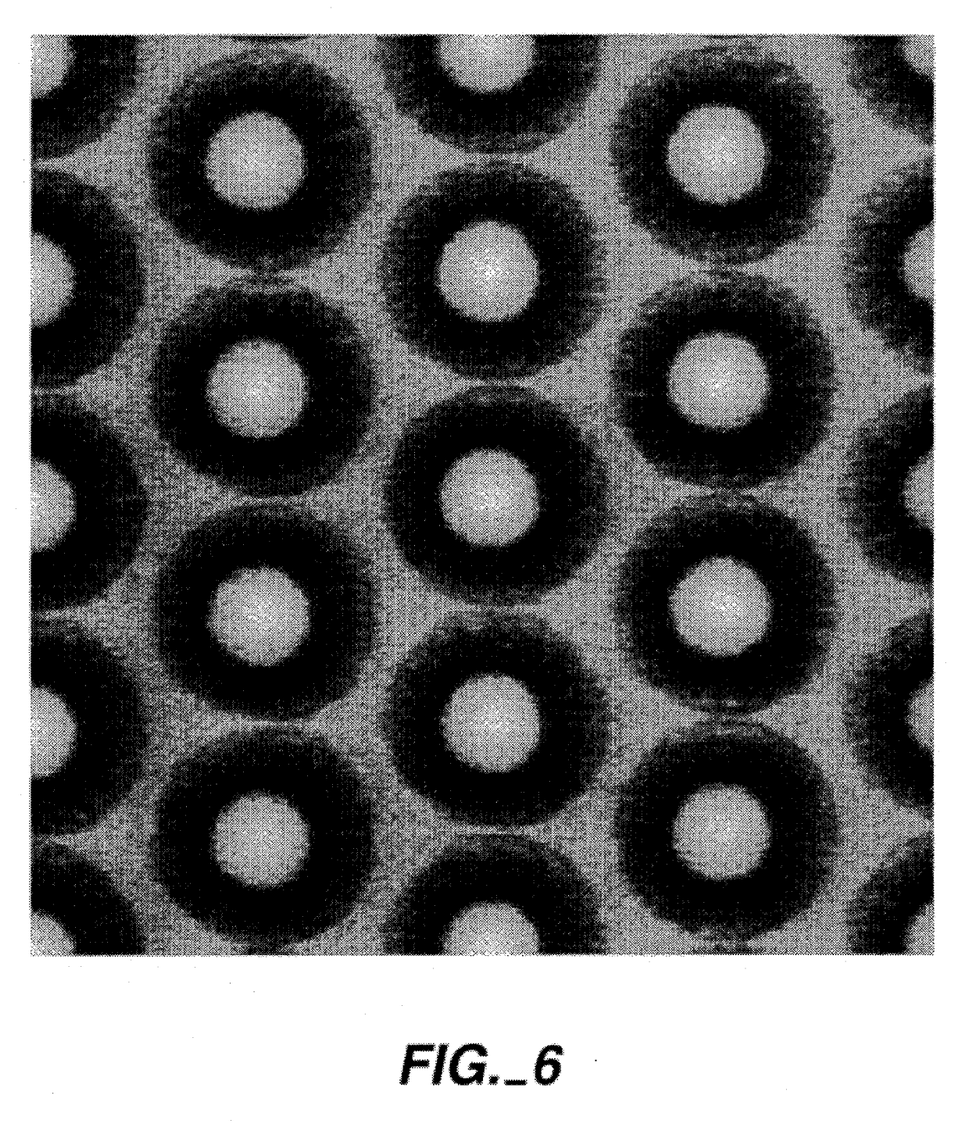
FIG. 6 is a corresponding scanning electron micrograph using the techniques of the present invention.

This new approach may be successfully applied to solve a number of vexing problems in monitoring semiconductor processes. For example, contact hole measurement has typically been done with a minimum or zero signal at the base of a structure, so that the measurement value obtained either has poor precision or is the result of extrapolation. Using the new approach, the signal exhibits its maximum at the base of the structure, allowing high-precision measurement with no need for extrapolation. FIG. 6 shows an example of a base-biased image. As in FIG. 5, the structures are 0.5 μm nominal contacts to silicon which are developed and etched into a 2.0 μm-thick layer of resist on oxide. In contrast to FIG. 5, the bottom of the contact hole is clearly visible as a white circle.

In accordance with one embodiment of the present invention, image information corresponding to features near a base of a microscopic high-aspect-ratio structure is extracted by directing a primary electron beam onto the structure and discriminating between 1) first backscattered electrons emitted from the structure within a cone of acceptance centered about the normal to a surface of the structure, and 2) second, other backscattered electrons emitted from the structure, both as a result of said primary electron beam being directed onto the structure. Using a detector, the first backscatter electrons are detected to produce a detection signal, and the detection signal is used to produce an image corresponding to features near the base of the structure.

In accordance with another embodiment of the invention, an imaging device includes a stage for supporting a wafer on which a microscopic structure is patterned, a mechanism for directing a primary electron beam onto the microscopic structure, a mechanism for discriminating between 1) first backscattered electrons emitted from the structure within a cone of acceptance centered about the normal to a surface of the structure, and 2) second, other backscattered electrons emitted from the structure, both as a result of said primary electron beam being directed onto the structure, a detector for detecting the first backscatter electrons to produce a detection signal, and an imaging device responsive to the detection signal for producing an image of the structure.

BRIEF DESCRIPTION OF THE DRAWINGS

The invention may be further understood from the following written description in conjunction with the appended drawings. In the drawings.

DETAILED DESCRIPTION OF THE PREFERRED EMBODIMENTS

Prior attempted solutions to the problem of imaging high-aspect-ratio structures have attempted to improve the signals-to-noise ratio of the detected signal by improving secondary electron collection efficiency. Secondary electron yields, however, are already high, approaching unity, therefore leaving little room for improvement. The techniques to be presently described take an opposite approach by concentrating instead on backscattered electrons (BSE) whose yield is much lower than that of secondary electrons. Backscatter yields are typically on the order of 10%. Despite their lower emission yields, however, backscattered electrons exhibit a much higher energy (nearly equal to the energy of the primary scanning electron beam, approximately 1000 eV) than secondary electrons (less than 10 eV). The high-energy backscattered electrons are extremely resistant to charge on the surface of the sample, as shown in FIG. 3, and therefore produce better images in regions of holes and trenches despite their lower emission yields.

Figure 7:
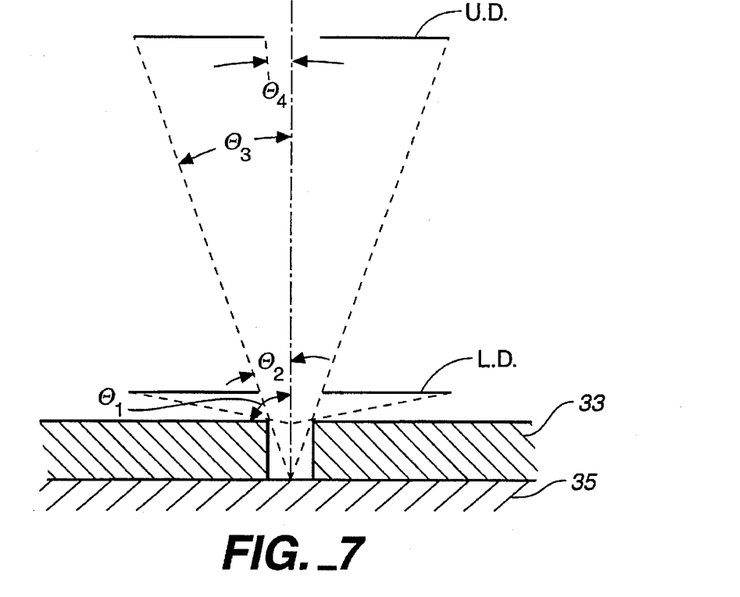
FIG. 7 is a diagram representing the operation of two signal detection sub-systems in accordance with the present invention.

Referring to FIG. 7, high-aspect-ratio structures such as microelectronic contact holes may be imaged using two signal detection subsystems, one optimized for imaging at the top and another optimized for imaging at the base of sub-micrometer structures. In a preferred embodiment, both detectors are of a microchannel plate detectors of a type well-known in the art. Hereinafter, the detector furthest removed from the object being imaged will be referred to as the upper detector (UD), and the detector closest to the object being imaged will be referred to as the lower detector (LD). As seen in FIG. 7, the imaging geometry associated with the lower detector is best adapted for imaging the top surface of the object, and the imaging geometry associated with the upper detector is best adapted for imaging at the base of troughs and holes. In particular, the lower detector receives backscatter emission of electrons in a solid angle defined by $\theta_1$, $\theta_2$ where $\theta_1$ is near 90° from the normal to the sample and $\theta_2$ is near 45° from the normal, so that the resulting signal is dominated by electrons from the top surface. The upper detector receives backscatter electrons in a solid angle described by $\theta_3$, $\theta_4$ where $\theta_3$ is less than 45° and $\theta_4$ is near 0°, so that the resulting signal is dominated by electrons from holes and trenches. As described hereinafter, a magnetic field-immersion objective lens may be used to accomplish adjustment of $\theta_1$, $\theta_2$, $\theta_3$ and $\theta_4$. The geometry of FIG. 7 accomplishes a spatial filtering whereby backscattered electrons and secondary emission electrons are discriminated from one another and imaged on the upper and lower detectors, respectively, to achieve top and base biased imaging. In a preferred embodiment, the lower detector is positioned inside an immersion electromagnetic lens, and the upper detector is positioned above the immersion electromagnetic lens.

Figure 8:
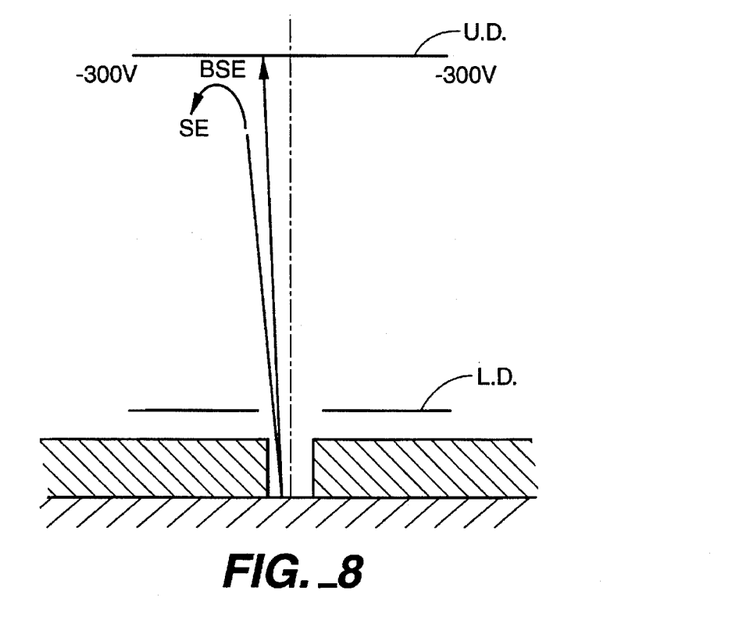
FIG. 8 is a corresponding diagram illustrating a negative-bias electron discrimination technique.

Referring to FIG. 8, the spatial filtering effect of the geometry illustrated in FIG. 7 may be augmented by energy filtering to prevent secondary electrons from being imaged on the upper detector. In a preferred embodiment, the face of the upper detector is negatively biased (for example, to about −300 volts) so as to repel the low-energy secondary electrons. The backscattered electrons, on the other hand, are of sufficiently high energy so as to remain substantially unaffected by the negative bias.

As a result of the spatial filtering and the energy filtering means illustrated in FIGS. 7 and 8, the signal from the lower detector is at a near-zero minimum when the base of the structure is being scanned, whereas the signal from the upper detector exhibits its maximum at the base of the structure, allowing high-precision measurement with no need for extrapolation. Assume that the primary electron beam is scanned across the cross-section shown in FIG. 9 in a left to right direction. As the top surface of the structure is being scanned, an abundance of electrons are emitted so as to strike the lower detector and produce a high level signal. Surface charge effects do not appreciably influence the signal. As the primary electron beam reaches the contact hole, however, the influence of surface charge effects increases. At the same time, fewer and fewer electrons reach the lower detector as a consequence of the lower detector imaging geometry. At the base of the hole, the signal from the lower detector therefore falls to a near-zero minimum. As the contact hole is passed over and the primary electron beam again lands on the upper surface of the structure, the signal from the lower detector again rises to a high level.

Figure 9:
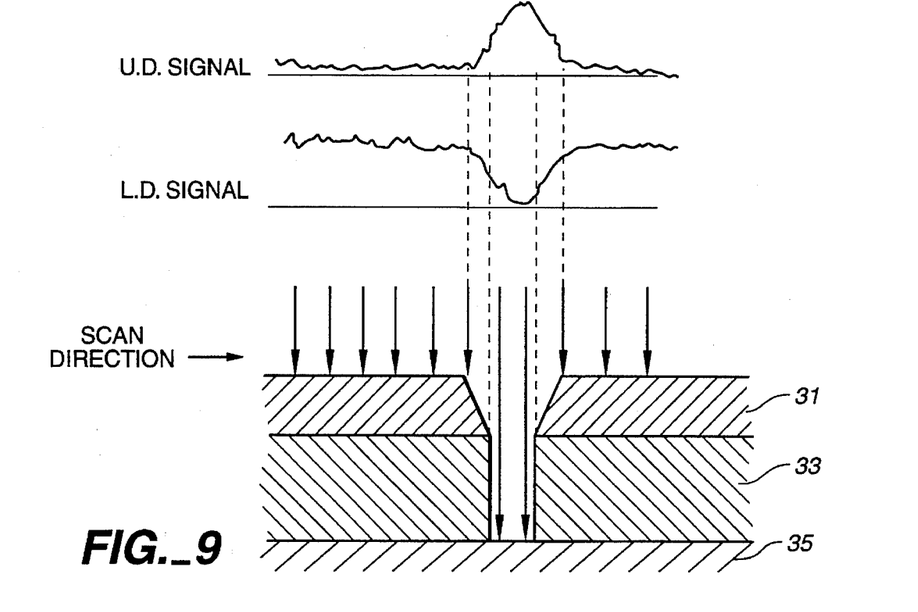
FIG. 9 is a diagram showing the opposite effect on upper and lower detector signals as a high-aspect-ratio contact hole is scanned.

The signal from the upper detector exhibits exactly the opposite behavior. Backscattered electron yield increases with the atomic number of the material on which the primary electron beams lands. Photoresist compositions in general have a relatively low atomic number, whereas silicon has a relatively high atomic number. As the surface of the structure is being scanned, relatively few backscattered electrons are produced. As the primary electron beam scans the bottom of the contact hole, large numbers of backscattered electrons am produced because of the high atomic number of silicon. As the primary electron beam passes over the contact hole and again lands on the upper surface of the structure, the number of backscattered electrons produced again decreases. This reverse image contrast (relative to the lower detector signal) is further assisted by the small acceptance angle of the upper detector, which reduces the unwanted signal from laterally scattered electrons emitted at the top surface of the structure. At the top surface of the structure, electrons are emitted in all directions. Within a contact hole, or other high aspect ratio structure, however, the electrons are subject to a collimating effect produced by the structure. Because of the small angle of acceptance of the upper detector, the latter "collimated" electrons are received on the upper detector in greater proportion than the former "undirected" surface electrons.

The fact that the BSE signal increases with the atomic number of the material is dramatically different as compared to the SE signal. The SE signal varies with surface topography, depends very heavily on the incident beam energy and current, and is sensitive to surface charging.

The correspondence between the scan signals produced by the lower and upper detectors in FIG. 9 and the corresponding images shown in FIG. 5 (lower detector) and FIG. 6 (upper detector) may be readily appreciated. In relation to FIG. 5, the signal from the lower detector drops to almost zero inside the contact hole, obscuring whatever information might otherwise have been extracted concerning the size and shape of the contact hole. In relation to FIG. 6, the signal from the upper detector reaches a peak level when the primary electron beam is inside the contact hole. The size and shape of the contact hole are therefore clearly shown.

Figure 10:
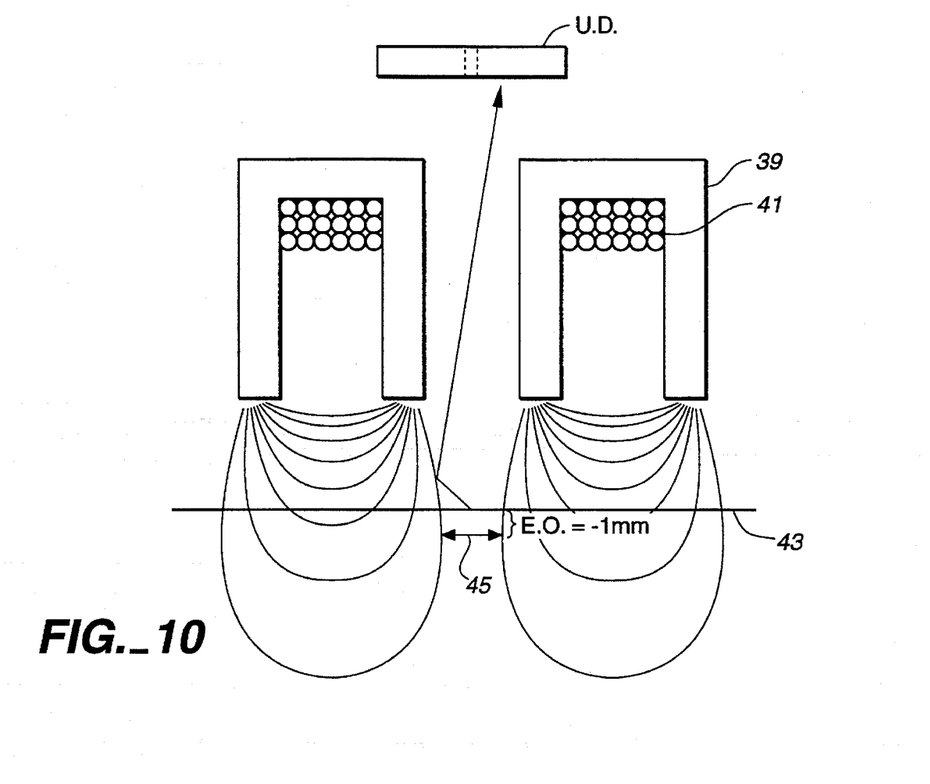
FIG. 10 is a diagram showing a negative electron optical working distance used in conjunction with the present invention.

Collection efficiency of backscattered electrons may be further increased by providing a negative electron optical working distance for the scanning electron microscope. Referring to FIG. 10, an electromagnetic immersion objective of the scanning electron microscope is principally composed of a toroidal, channel-shaped magnetic polepiece 39 and an electric winding 41 wound inside the channel of the polepiece. The electromagnetic immersion lens produces a magnetic flux pattern as shown. Conventionally, the magnetic flux pattern is precisely controlled in such a way as to compensate for aberrations. In conventional scanning electron microscopes, however, the electron-optical working distance is typically positive. The electron-optical working distance refers to the distance between the surface plane of the wafer (43) and a plane corresponding to a region of maximum flux density (45). In a preferred embodiment, this distance is slightly negative (approximately- 1mm). In other words, the plane of the wafer surface (43) is positioned above a plane (45) corresponding to a region of maximum flux density. The effect of this slightly negative electron-optical working distance is to sweep backscattered electrons onto channel plates of the upper and lower detectors. In particular, a negative electron optical working distance causes backscattered electrons to strike the detectors even when the electrons are emitted at a significant angle from normal. Since backscattered electrons are low-yield, the resulting increase in collection efficiency is of considerable significance.

Figure 11:
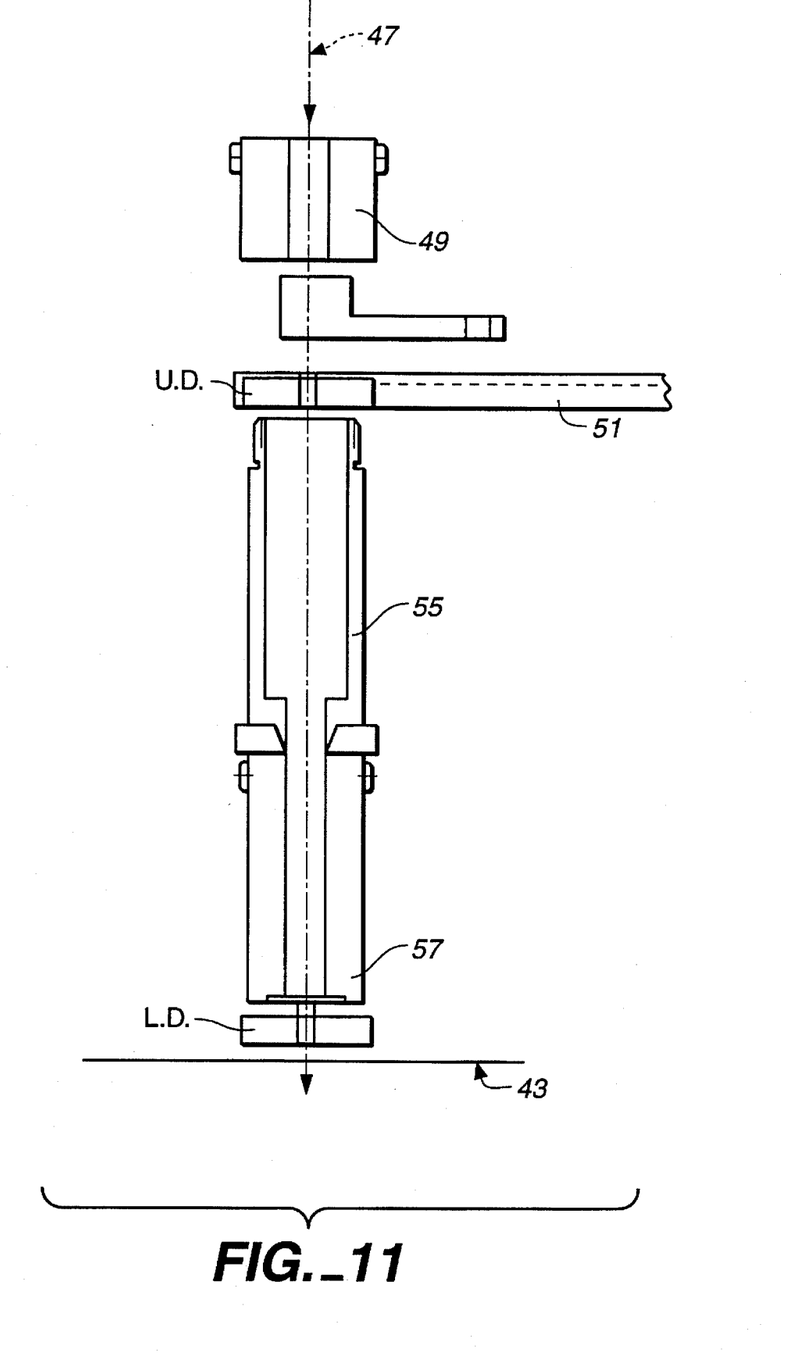
FIG. 11 is a sectional view of an optical column in accordance with an embodiment of the present invention.

FIG. 11 shows in detail the electron column of a scanning electron microscope according to a preferred embodiment of the present invention. The electron beam path is represented by a vertical broken line 47 and extends down to the wafer plane 43. An upper octupole assembly 49 functions to position the electron beam. An upper detector assembly 51 houses the upper detector, preferably a microchannel plate detector. A magnetic lens liner 55 is a tellurium copper shield that protects the beam from disturbances that might otherwise be created by eight teflon-coated wires used to control the octupole. It also holds the octupole in place. A lower octupole assembly 57 functions to scan the electron beam back and forth across the surface of the wafer. The lower detector opposes the wafer surface and is preferably a microchannel plate detector.

Figure 12:
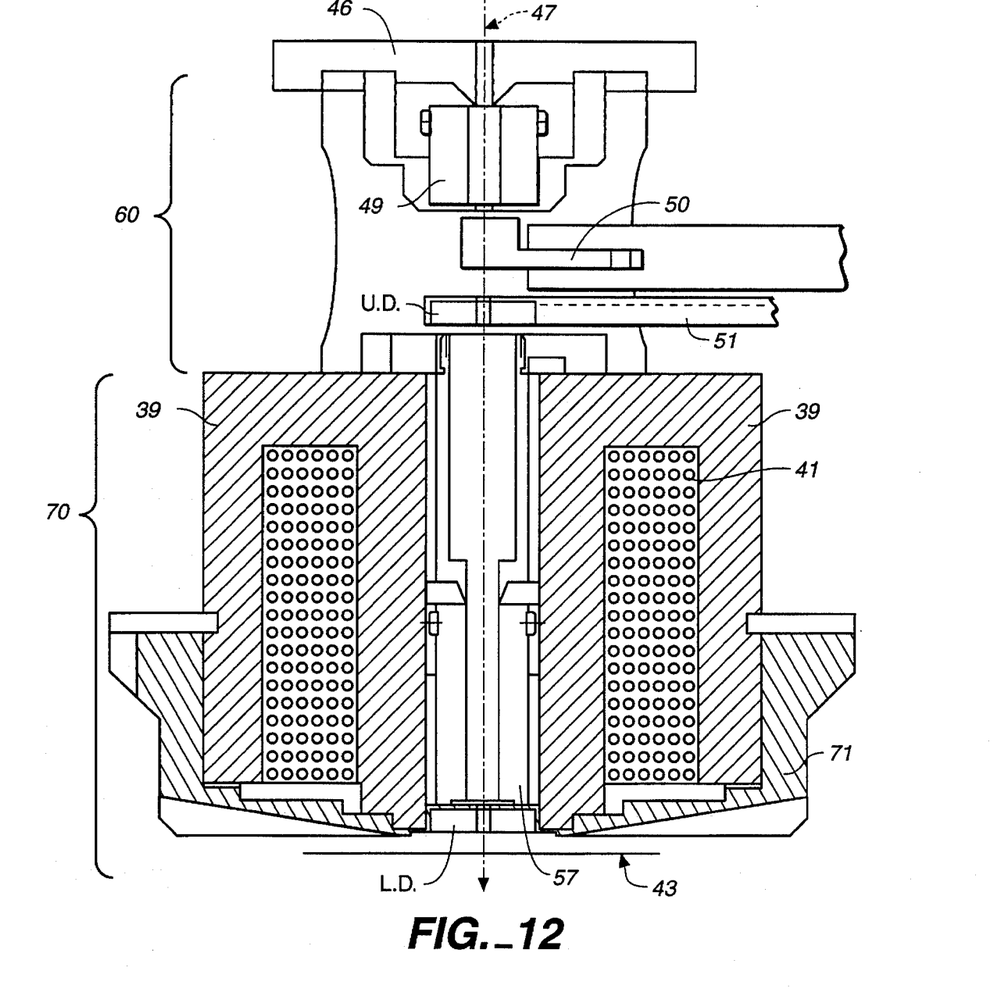
FIG. 12 is a sectional view showing in greater detail features of the electron optics of an embodiment of the present invention.

FIG. 12 shows the complete electron optics of a scanning electron microscope according to a preferred embodiment of the invention. An upper column assembly 60 houses the upper octupole, the spray aperture assembly 50 and the upper detector assembly 51 and includes an electron gun interface 46. A magnetic lens assembly 70 includes a magnetic lens pole-piece 39 and electric winding 41. Attached to the polepiece is a lens cap 71. The magnetic lens liner extends inside the magnetic lens assembly 70. Also housed inside the magnetic lens assembly 70 are the lower octupole assembly 57 and the lower detector.

Figure 13:
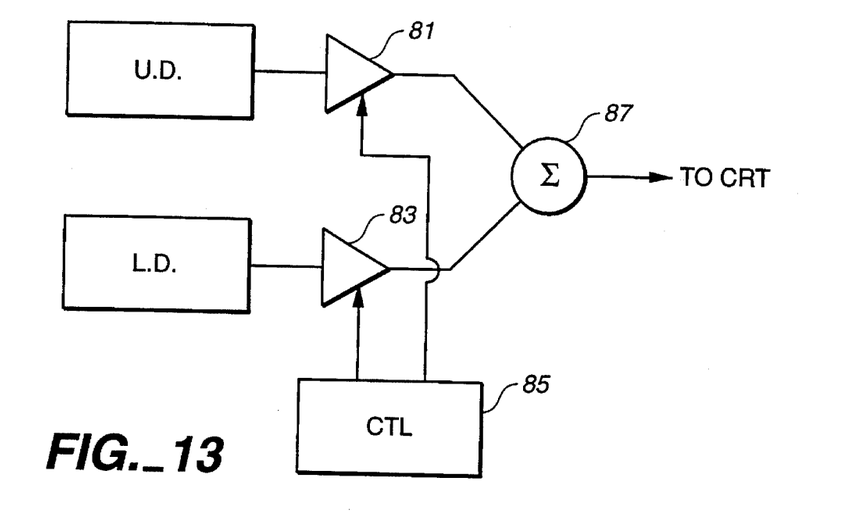
FIG. 13 is a block diagram of circuitry for combining signals from the upper and lower detectors.

The signals from the upper and lower detectors need not be used in exclusion to one another. Referring to FIG. 13, preferably, the signals from the upper and lower detectors are combined in a variable ratio in accordance with a control arrangement to produce an image resembling an "extended focus" image. The signals may be combined in real time to produce a mixedsignal image having the inherent linearity and resolution characteristic of electron-beam technology. In particular, signals from the upper and lower detectors are input to variable-gain amplifiers 81 and 83, respectively. The gains of the amplifiers are set in accordance with control signals from a control unit 85. The output signals from the amplifiers are then summed in a summer 87, the output of which is sent to the CRT display.

In order to use backscattered electrons as the primary imaging mechanism for high aspect ratio structures, instead of the more widely used secondary electrons, a high beam current is required (because of the low yield of backscattered electrons). When inspecting or measuring highly insulating materials, if the beam current is too high, it may cause the sample to charge to potentials comparable to the incident beam energy, affecting the effective electron landing energy. Sample charging results from insufficient time for the electrons to dissipate to the underlying conductors.

Figure 14:
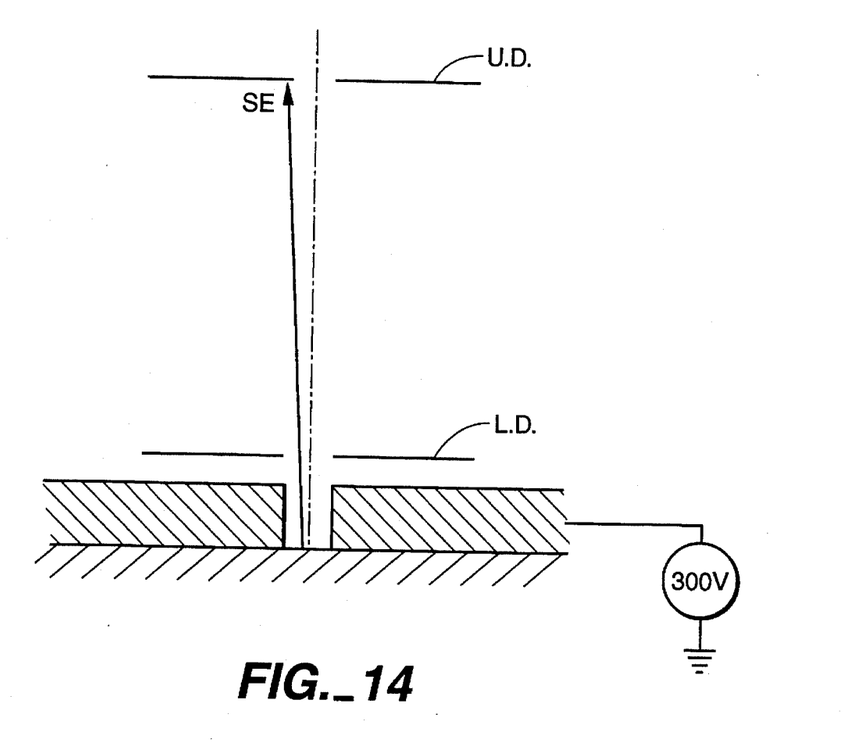
FIG. 14 is a diagram representing detection of secondary electrons at an upper detector in accordance with an alternate embodiment of the invention.

Under these conditions, the beam current may be lowered and the upper detector may advantageously be used to detect secondary electrons instead of backscattered electrons as previously described. Lowering the beam current reduces surface charging, improving resolution and measurement precision in the case of highly insulated materials. By detecting secondary electrons at the upper detector, the capability to observe the bottom of high aspect ratio structures (such as trenches) is preserved under conditions as shown in FIG. 14. As can be observed from that drawing, the collection of secondary electrons at the upper detector is facilitated by applying a bias voltage of about −160V to the wafer. The face of the upper detector, instead of being negatively biased as before, is now unbiased. Secondary electrons are accelerated pushed up the column to the upper detector, where they exhibit trajectories more similar to those of backscattered electrons.

The foregoing has described the principles, preferred embodiments and modes of operation of the present invention. However, the invention should not be construed as limited to the particular embodiments discussed. Instead, the above-described embodiments should be regarded as illustrative rather than restrictive, and it should be appreciated that variations may be made in the embodiments by workers skilled in the art without departing from scope of the present invention as defined by the following claims.

What is claimed:

1. A method of extracting image information corresponding to features near a base of a microscopic high-aspect-ratio structure using an electron beam device having a detection aperture, comprising the steps of:

directing a primary electron beam onto said structure;

discriminating between 1) first backscattered electrons emitted from said structure within a cone of acceptance centered about the normal to a surface of said structure, and 2) second, other backscattered electrons emitted from said structure, both as a result of said primary electron beam being directed onto said structure;

using a detector, detecting said first backscattered electrons to produce a detection signal; and using said detection signal to produce an image corresponding to features near the base of said structure.

2. The method of claim 1 wherein said discriminating step comprises locating said detector relative to said detection aperture and an upper surface of said structure such that said detector subtends an angle having a vertex at a level of said upper surface of said structure, said angle extending no more than 45° on either side of a normal to said upper surface of said structure.

3. An apparatus for inspecting and/or measuring wafer structure, comprising:

stage means for supporting a wafer on which a microscopic structure is patterned;

means for directing a primary electron beam onto said microscopic structure;

means for discriminating between 1) first backscattered electrons emitted from said structure within a cone of acceptance centered about the normal to a surface of said structure, and 2) second, other backscattered electrons emitted from said structure, both as a result of said primary electron beam being directed onto said structure;

first detector means for detecting said first backscattered electrons to produce a first detection signal; and imaging means responsive at least in part to said first detection signal for producing an image of said structure.

4. The apparatus of claim 3, further comprising:

second detector means for detecting said second backscattered electrons to produce a second detection signal; and mixing means for mixing said first and second detection signals in variable proportion to one another to produce a mixed detection signal;

wherein said imaging means is responsive to said mixed detection signal for producing an image of said structure.

5. The apparatus of claim 4, wherein said first and second detector means are first and second microchannel plate detectors each having a central primary electron beam exposure aperture.

6. The apparatus of claim 5 wherein said first microchannel plate detector is disposed above said second microchannel plate detector with beam exposure apertures of said microchannel plate detectors being vertically aligned.

7. The apparatus of claim 6 wherein said beam exposure aperture of said second microchannel plate detector functions as a detection aperture for said first microchannel plate detector.

8. The apparatus of claim 7 wherein said stage, said second microchannel plate detector, and said first microchannel plate detector are positioned relative to one another such that said first microchannel plate detector subtends an angle having a vertex at a level of an upper surface of said structure, said angle extending no more than 45° on either side of a normal to said upper surface of said structure.

9. The apparatus of claim 8, further comprising magnetic lens means for focussing said electrons on said detectors.

10. The apparatus of claim 9 wherein said stage means and said magnetic lens means are located relative to one another such that said wafer is located at a negative electron-optical working distance, causing said second backscattered electrons to impinge said first microchannel plate detector at a significant angle from the normal.

* * * * *

UNITED STATES PATENT AND TRADEMARK OFFICE

CERTIFICATE OF CORRECTION

PATENT NO. : 5,493,116

ISSUED : February 20, 1996

INVENTOR(S) : Toro-Lira et al.

It is certified that an error appears in the above-identified patent and that said Letters Patent is hereby corrected as shown below:

In Figure 14, --300V-- should be "-160V".

Signed and Sealed this

Thirty-first Day of March, 1998

Attest:

BRUCE LEHMAN

*Attesting Officer*     Commissioner of Patents and Trademarks